United States Patent
Tuulos et al.

(10) Patent No.: US 9,739,914 B2
(45) Date of Patent: Aug. 22, 2017

(54) COLOR IMAGE SENSING

(75) Inventors: Eero Tuulos, Vuorentausta (FI); Samu Koskinen, Tampere (FI)

(73) Assignee: Nokia Technologies Oy, Espoo (FI)

( * ) Notice: Subject to any disclaimer, the term of this patent is extended or adjusted under 35 U.S.C. 154(b) by 392 days.

(21) Appl. No.: 13/809,667

(22) PCT Filed: Jul. 13, 2010

(86) PCT No.: PCT/IB2010/053197
§ 371 (c)(1),
(2), (4) Date: Feb. 22, 2013

(87) PCT Pub. No.: WO2012/007791
PCT Pub. Date: Jan. 19, 2012

(65) Prior Publication Data
US 2013/0168795 A1  Jul. 4, 2013

(51) Int. Cl.
*G06K 9/00* (2006.01)
*G02B 5/20* (2006.01)
*H01L 27/146* (2006.01)

(52) U.S. Cl.
CPC .......... *G02B 5/20* (2013.01); *H01L 27/14621* (2013.01); *H01L 27/14685* (2013.01)

(58) Field of Classification Search
CPC . G06T 3/4015; H04N 9/045; H04N 2209/046
USPC ........................................ 382/162, 289, 293
See application file for complete search history.

(56) References Cited

U.S. PATENT DOCUMENTS

| | | | |
|---|---|---|---|
| 3,971,065 A | 7/1976 | Bayer | 358/41 |
| 4,939,573 A | 7/1990 | Teranishi et al. | 358/44 |
| 2006/0133697 A1 | 6/2006 | Uvarov et al. | 382/300 |
| 2007/0024879 A1 | 2/2007 | Hamilton, Jr. et al. | 358/1.9 |
| 2007/0024931 A1 | 2/2007 | Compton et al. | 358/512 |
| 2007/0076269 A1 | 4/2007 | Kido et al. | 358/474 |
| 2008/0292182 A1 | 11/2008 | Morales et al. | 382/162 |
| 2009/0230287 A1 | 9/2009 | Anderson et al. | 250/208.1 |

FOREIGN PATENT DOCUMENTS

WO    WO 2010/144124 A1    12/2010

OTHER PUBLICATIONS

Bayer filter, http://en.wikipedia.org/wiki/Bayer_filter, Jun. 18, 2010, 4 pgs.
Honda, H., et al., "High Sensitivity Color CMOS Image Sensor with WRGB Color Filter Array and Color Separation Process Using Edge Detection", pp. 263-266.
Sony, ClearVid CMOS Sensor, www.sony.net, Jun. 18, 2010, 5 pgs.

*Primary Examiner* — Samuel Gebremariam
(74) *Attorney, Agent, or Firm* — Harrington & Smith

(57) ABSTRACT

An apparatus including a plurality of sensor elements, configured in an arrangement having a repeating pattern of sensor elements, the plurality of sensor elements including first monochromatic sensor elements configured to sense visible light of a first color; second monochromatic sensor elements configured to sense visible light of a second color; and panchromatic sensor elements configured to sense visible light of at least the first color and the second color, wherein the majority of the plurality of sensor elements are panchromatic sensor elements.

16 Claims, 3 Drawing Sheets

COLOR IMAGE SENSING

TECHNOLOGICAL FIELD

Figure 1:
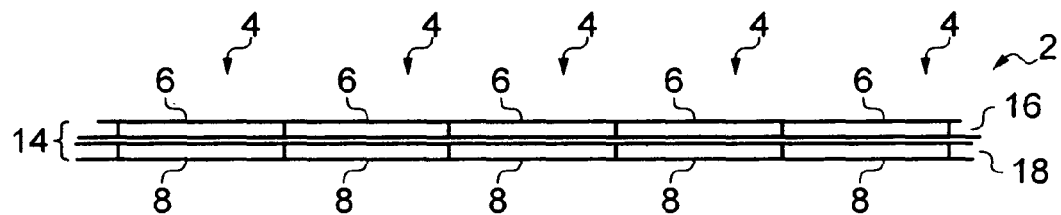

Embodiments of the present invention relate to color image sensing.

BACKGROUND

Color imaging sensor arrangements typically comprise an arrangement of colored filters that overlie an array of optical sensors. Each optical sensor has an associated colored filter. Commonly the colored filters are configured in a Bayer pattern. This is a repetitive pattern in which a common two by two array of colored filters are tessellated to form the arrangement of colored filters. The two by two array comprises two green filters at a first pair of diagonal corners and a red filter and a blue filter at a second pair of diagonal corners.

BRIEF SUMMARY

According to various, but not necessarily all, embodiments of the invention there is provided an apparatus comprising: a plurality of sensor elements, configured in an arrangement having a repeating pattern of sensor elements, the plurality of sensor elements comprising: first monochromatic sensor elements configured to sense visible light of a first color; second monochromatic sensor elements configured to sense visible light of a second color; and panchromatic sensor elements configured to sense visible light of at least the first color and the second color, wherein the majority of the plurality of sensor elements are panchromatic sensor elements.

According to various, but not necessarily all, embodiments of the invention there is provided a filter arrangement comprising a plurality of sensor filters for filtering light transmitted to a corresponding plurality of light sensors, wherein the sensor filters are arranged in a repeating pattern, and comprise: first monochromatic sensor filters configured to transmit predominantly visible light of a first color but not a second color; second monochromatic sensor filters configured to transmit predominantly visible light of the second color but not the first color; and panchromatic sensor filters configured to transit visible light of at least the first color and the second color, wherein the majority of the plurality of sensor filters are panchromatic sensor elements.

According to various, but not necessarily all, embodiments of the invention there is provided a method comprising: providing for the filtering of light incident on optical sensors using a filter arrangement having a repeating pattern of sensor filters comprising: first monochromatic sensor filters configured to sense visible light of a first color significantly more than a second color; second monochromatic sensor filters configured to sense visible light of a second color significantly more than the first color; and panchromatic sensor filters configured to sense visible light of at least the first color and the second color, wherein the majority of the sensor filters are panchromatic sensor filters.

By increasing the number of panchromatic sensor elements more light is detected by the apparatus increasing its sensitivity. This increase in sensitivity enables the use of sensor elements of smaller detection area which enables the number of sensor elements per unit area to be increased.

BRIEF DESCRIPTION

For a better understanding of various examples of embodiments of the present invention reference will now be made by way of example only to the accompanying drawings in which:

FIG. 1 schematically illustrates, in a cross-sectional view, an apparatus 2 comprising a plurality of sensor elements 4

Figure 5:
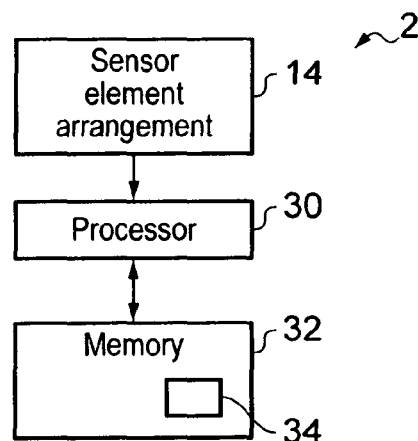
Figure 2:
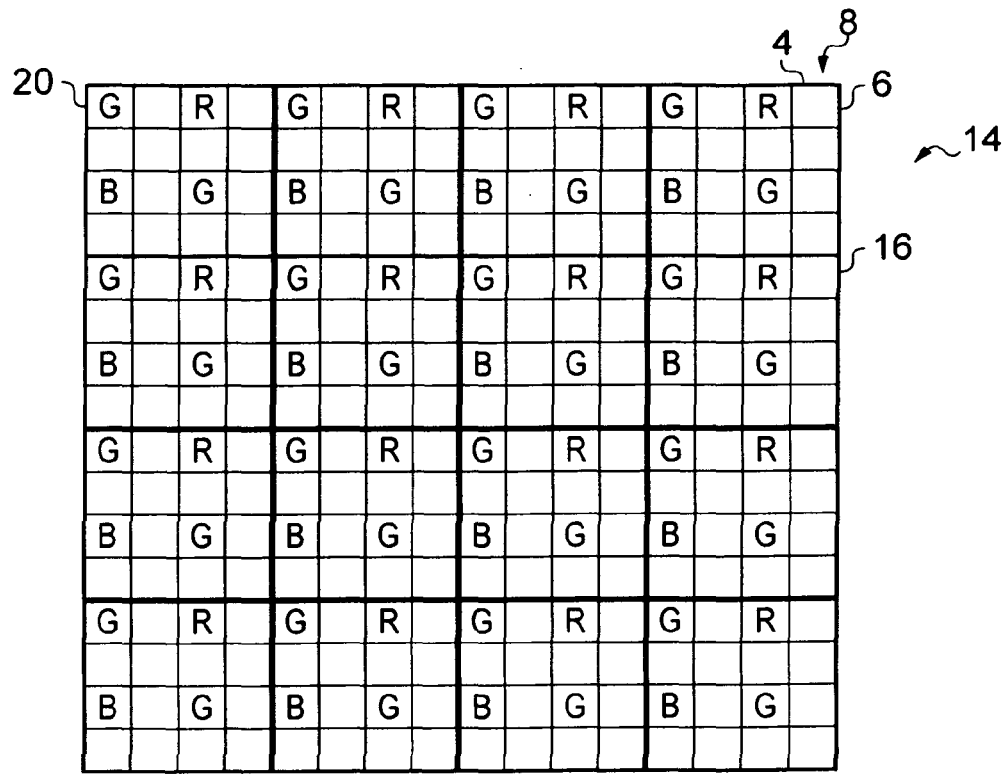
Figure 3:
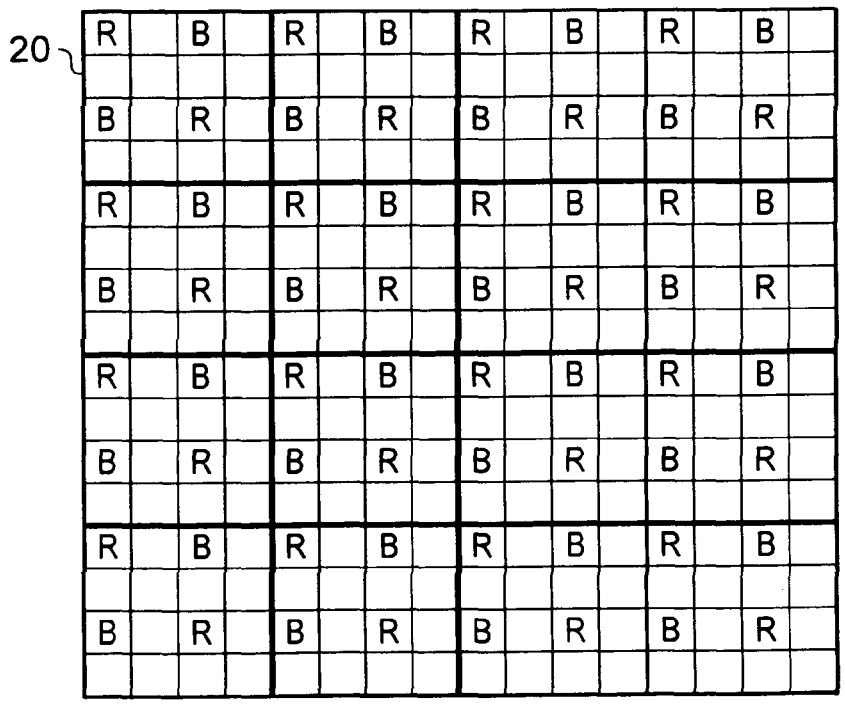
Figure 4:
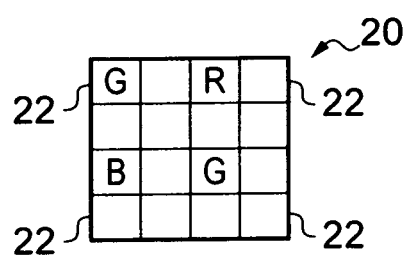
Figure 6:
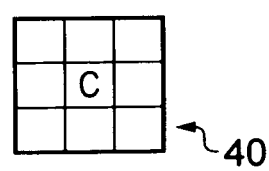

FIG. 2 schematically illustrates an example of sensor filters 6 arranged in a first repeating pattern;

FIG. 3 schematically illustrates an example of sensor filters 6 arranged in a second repeating pattern;

FIG. 4 schematically illustrates a common base unit of sensor filters used to form the first repeating pattern FIG. 5 schematically illustrates some but not all of the functional components of an apparatus 2; and FIG. 6 schematically illustrates a local group of sensor elements as used in digital processing of the outputs from the sensor elements.

Figure 7:
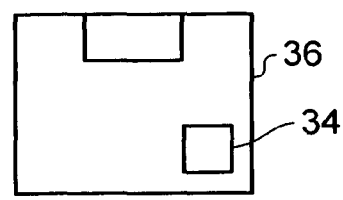

FIG. 7 schematically illustrates an example of a delivery mechanism for a computer program.

DETAILED DESCRIPTION

FIG. 1 schematically illustrates, in a cross-sectional view, an apparatus 2 comprising a plurality of sensor elements 4 configured in a sensor element arrangement 14. The majority of the plurality of sensor elements 4 are panchromatic sensor elements.

The apparatus 2 may, for example, be a color imaging device or a module for a color imaging device. One example of a color imaging device is a color digital camera. The color imaging may be high definition, for example, the number of sensor elements 4 in the arrangement 14 may be greater that 8 million.

The arrangement 14 of sensor elements 4 comprises an underlying sensor arrangement 18 of a plurality of optical sensors 8 and an overlying filter arrangement 16 of sensor filters 6.

The optical sensors 8 may be semiconductor devices that are arranged in a two dimensional array to form the sensor arrangement 18. The optical sensors 8 may be integrated into a semiconductor wafer.

Each optical sensor 8 has an associated overlying sensor filter 6 that filters light transmitted to the underlying optical sensor 8 for detection. Each combination of optical sensor 8 and associated overlying sensor filter 6 forms a sensor element 4.

The sensor filters 6 may have different optical transmission properties. They may for example be monochromatic (colored) or panchromatic. (uncolored). The monochromatic and panchromatic sensor filters 6 are arranged in a repeating pattern within the filter arrangement 16. This creates a sensor element arrangement 14 that has the same a repeating pattern of different colored sensor elements 4.

FIG. 2 schematically illustrates an example of sensor filters 6 arranged in a first repeating pattern in a first filter arrangement 16 creating a first sensor element arrangement 14 having the first repeating pattern. The monochromatic sensor filters comprise red filters, blue filters and green filters.

FIG. 3 schematically illustrates an example of sensor filters 6 arranged in a second repeating pattern in a second filter arrangement 16 creating a second sensor element arrangement 14 having the second repeating pattern. The monochromatic sensor filters comprise red filters and blue filters but not green filters.

In FIGS. 2 and 3, the filtering arrangement 16 comprises first monochromatic sensor filters (labeled R in the Figures) configured to transmit visible light of a first color (red), second monochromatic sensor filters (labeled B in the Figures) configured to transmit visible light of the second color (blue) and panchromatic sensor filters (unlabeled in the Figures) configured to transit all visible light.

The first monochromatic sensor filters are configured to transmit predominantly visible light of the first color (red). The first monochromatic sensor filters are configured to transmit significantly more visible light of the first color (red) than the second color (blue).

The second monochromatic sensor filters are configured to transmit predominantly visible light of the second color (blue). The second monochromatic sensor filters are configured to transmit significantly more visible light of the second color (blue) than the second color (red).

The panchromatic sensor filters are configured to transmit predominantly visible light of all colors.

A monochromatic filter may be an absolute monochromatic filter that only transmits monochromatic light or a relative monochromatic filter that transmits significantly more monochromatic light that other visible light. For example, a relative monochromatic filter may transmit some panchromatic visible light but it more strongly attenuates panchromatic visible light outside the narrow monochromatic spectrum. Monochromatic light may have a spectrum range, for example, of 20-100 nm or less. For example second monochromatic sensor filters (Blue) may pass some amount of light over the whole visible spectrum. As an example, the transmission may be ~90% at a wavelength of 440 nm, >50% in wavelengths between 380 and 500 nm and 5% at wavelengths greater than 500 nm such as 620 nm (red).

In FIG. 2, but not FIG. 3, the filter arrangement 16 additionally comprises third monochromatic sensor filters (labeled G in the Figures) configured to transmit visible light of a third color (green).

A monochromatic filter provides significant attenuation in all but a specific and limited area of the visible spectrum. It operates as a narrowband band pass filter for light.

A panchromatic filter does not provide significant attenuation in any part of the visible spectrum. It may or may not provide attenuation outside the visible spectrum.

The majority of the plurality of sensor filters 6 are panchromatic sensor filters. In the illustrated examples, there are three times as many panchromatic sensor elements per unit area as monochromatic sensor elements. Each monochromatic sensor element is separated from a nearest neighbor monochromatic sensor element (of a different color) by one panchromatic sensor element.

In the illustrated examples, the filter arrangement 16 (and sensor element arrangement 14) comprises a common base unit 20 repeated in a mosaic. The common base unit 20 comprises a four by four array of sensor filters 6. The common base units 20 are tessellated to form the arrangement 16, which overlies the optical sensors 8 to form the sensor element arrangement 14.

The majority of the sensor filters 6 in a common base unit 20 are panchromatic sensor filters. In a common base unit, each monochromatic sensor filter is separated from a nearest neighbor monochromatic sensor filter by one panchromatic sensor filter.

The common base unit 20 is formed from a plurality of sub units 22 as illustrated in FIG. 4. The common base unit 20 comprises a two by two array of tessellated sub units 22.

Each sub unit 22 comprises a majority of panchromatic sensor filters and a single monochromatic sensor filter 6. The 'color' of a sub unit is defined by the color of the single monochromatic sensor filter 6. The single monochromatic sensor filter of a sub unit 22 has a common fixed position within the sub unit 22 for each of the plurality of sub units in a common base unit 20.

The sub units 22 are arranged, within a common base unit 20, in rows and columns within the common base unit. Sub units 22 that share the same column but are in adjacent rows have different color. Sub units that share the same row but are in adjacent columns have different color.

In FIG. 2, one pair of sub units 22 that are positioned diagonally within the common base unit 20 have the same color (green) whereas the other pair of sub units 22 that are positioned diagonally within the common base unit 20 have the different colors (red, blue). As a consequence, the sub units 22 for a 'Bayer pattern' within the filter arrangement 14.

In FIG. 3, one pair of sub units 22 that are positioned diagonally within the common base unit 20 have the same color (red) whereas the other pair of sub units 22 that are positioned diagonally within the common base unit 20 also have a common but different color (blue)

Referring to FIG. 2, first monochromatic (red) sensor filters R are consequently configured in a first repeating pattern within the filter arrangement 16. The first repeating pattern can be defined by: $\{(3+4m, 1+4n)\ m=0\ldots M, n=0\ldots N\}$.

Second monochromatic (blue) sensor filters B are configured in a second repeating pattern within the filter arrangement 16. The second repeating pattern can be defined by: $\{(1+4m, 3+4n)\ m=0\ldots M, n=0\ldots N\}$.

The first repeating pattern and the second repeating pattern comprise the same common repeat pattern having a common period P in both a first direction (row-wise) and a second, orthogonal direction (column-wise). The first repeating pattern and the second repeating pattern are respectively offset by P/2, one half the common period.

Third monochromatic (green) sensor filters G are configured in a third repeating pattern within the filter arrangement 16. The third repeating pattern can be defined by: $\{(1+4m, 1+4n); (3+4m, 3+4n);\ m=0\ldots M, n=0\ldots N\}$.

There are twice as many third monochromatic (green) sensor filters G than first monochromatic (red) sensor filters R. There is the same number of second monochromatic (blue) sensor filters B as first monochromatic (red) sensor filters R.

Each common base unit 20 comprises a monochromatic sensor element 4 configured to sense red light, a monochromatic sensor element 4 configured to sense blue light, two monochromatic sensor elements 4 configured to sense green light and twelve panchromatic sensor elements 4.

Referring to FIG. 3, first monochromatic (red) sensor filters R are configured in a repeating pattern within the filter arrangement 16. The repeating pattern can be defined by: $\{(1+4m, 1+4n); (3+4m, 3+4n)\ m=0\ldots M, n=0\ldots N\}$.

Second monochromatic (blue) sensor filters B are configured in a repeating pattern within the filter arrangement 16. The second repeating pattern can be defined by: $\{(3+4m, 1+4n); (1+4m, 3+4n)\ m=0\ldots M, n=0\ldots N\}$.

There is the same number of second monochromatic (blue) sensor filters B as first monochromatic (red) sensor filters R.

Each common base unit 20 comprises two monochromatic sensor elements R configured to sense red light, two monochromatic sensor elements B configured to sense blue light and twelve panchromatic sensor elements.

FIG. 5 schematically illustrates some but not all of the functional components of the apparatus 2. The apparatus 2 comprises: at least one processor 30; and at least one memory 32 including computer program code 34. The at least one memory and the computer program code are configured to, with the at least one processor, cause the apparatus 2 at least to perform luminance interpolation. Chrominance interpolation may also be performed.

The processor 30 is configured to read from and write to the memory 32. The processor 30 may also comprise an output interface via which data and/or commands are output by the processor 30 and an input interface via which data and/or commands are input to the processor 30.

The memory 32 stores a computer program 34 comprising computer program instructions that control the operation of the apparatus 2 when loaded into the processor 30. The computer program instructions 34 provide the logic and routines that enables the apparatus to perform the methods described below. The processor 30 by reading the memory 32 is able to load and execute the computer program 34.

The computer program may arrive at the apparatus 2 via any suitable delivery mechanism 36, as illustrated in FIG. 7. The delivery mechanism 36 may be, for example, a computer-readable storage medium, a computer program product, a memory device, a record medium such as a compact disc read-only memory (CD-ROM) or digital versatile disc (DVD), an article of manufacture that tangibly embodies the computer program 34. The delivery mechanism may be a signal configured to reliably transfer the computer program 34.

The apparatus 2 may propagate or transmit the computer program 34 as a computer data signal.

Although the memory 32 is illustrated as a single component it may be implemented as one or more separate components some or all of which may be integrated/removable and/or may provide permanent/semi-permanent/dynamic/cached storage.

The apparatus 2 determines luminance for each picture element (pixel) corresponding to a monochromatic sensor element. This is achieved by creating local groups 40 of sensor elements 4 as schematically illustrated in FIG. 6. Each local group 40 comprises a three by three array of sensor elements 4 with the monochromatic sensor element 4 positioned at the centre with panchromatic sensor elements forming the eight surrounding adjacent sensor elements 4. The eight surrounding panchromatic sensor elements include four corner sensor elements and four edge sensor elements.

The apparatus 2 determines a weighted average luminance for each local group 40 of sensor elements 4.

The luminance value of each sensor element 4 in a local group 40 of sensor elements is weighted by multiplication with a weighting parameter. The weighted luminance values are summed and the summation is normalized.

The weighting parameter applied to each luminance value depends upon a position of the respective sensor element within the local group and the color of the respective monochromatic sensor element in the local group 40.

A common weighting parameter may be used in respect of edge sensor elements of the local group. The common weighting parameter may vary with the color of the respective monochromatic sensor element in the local group 40.

A common weighting parameter may be used in respect of corner sensor elements of the local group. The common weighting parameter may vary with the color of the respective monochromatic sensor element in the local group 40. Typically the common corner weighting parameter is less than the common edge weighting parameter.

| Color of Central Sensor Element | Parameter for 4 corner panchromatic sensor elements | Parameter for 4 edge panchromatic sensor elements | Parameter for central monochromatic sensor element |
|---|---|---|---|
| G | 5 | 8 | 76 |
| B | 12 | 17 | 12 |
| R | 9 | 13 | 40 |

The normalizing value is 128.

The apparatus 2 may determine chrominance for each picture element (pixel) corresponding to a sensor element by linear interpolating between the luminance values for the nearest bridging monochromatic sensor elements of the same color.

For example, if a target panchromatic sensor is between two monochromatic sensors having the same color C and is d1 sensor elements from one of the monochromatic sensors which provides output L1 and is d2 sensor elements from the other of the monochromatic sensors which provides output L2, then the interpolated value for color C is $d1/(d1+d2)*L1 + d2/(d1+d2)*L2$.

The apparatus 2 may additionally or alternatively determine chrominance for each picture element corresponding to a panchromatic sensor element by using the difference between the outputs from nearest neighbor sensor elements. The output from the panchromatic sensor is dependent upon red, green and blue components whereas the output from a monochromatic sensor is dependent upon one of red, green and blue. The difference therefore is dependent upon a pair of red, green and blue. The contribution of each color in the pair can be estimated by adjusting for detection sensitivity for each color component.

If the neighboring colored monochromatic sensor is green, the red component may be found by multiplying the difference between the output from the panchromatic sensor element and the output from neighboring green sensor element by $Rc/(Rc+Bc)$, where $Rc=0.299$ and $Bc=0.114$. The blue component may be found by multiplying the difference between the output from the panchromatic sensor element and the output from neighboring green sensor element by $Bc/(Rc+Bc)$, where $Rc=0.299$ and $Bc=0.114$.

If the neighboring colored monochromatic sensor is blue, the red component may be found by multiplying the difference between the output from the panchromatic sensor element and the output from neighboring blue sensor element by $Rc/(Rc+Gc)$, where $Rc=0.299$ and $Gc=0.587$. The green component may be found by multiplying the difference between the output from the panchromatic sensor element and the output from neighboring blue sensor element by $Gc/(Rc+Gc)$, where $Rc=0.299$ and $Gc=0.587$.

If the neighboring colored monochromatic sensor is red, the blue component may be found by multiplying the difference between the output from the panchromatic sensor element and the output from neighboring blue sensor element by $Bc/(Bc+Gc)$, where $Bc=0.114$ and $Gc=0.587$. The green component may be found by multiplying the difference between the output from the panchromatic sensor element and the output from neighboring blue sensor element by $Gc/(Bc+Gc)$, where $Bc=0.114$ and $Gc=0.587$.

Red and blue components may be found by multiplying the difference between an estimate of the output from the panchromatic sensor element attributable to green and the output from a neighboring green sensor element by Rc/(Rc+Bc) and Bc/(Rc+Bc) respectively.

Red and green components may be found by multiplying the difference between an estimate of the output from the panchromatic sensor element attributable to blue and the output from a neighboring blue sensor element by Rc/(Rc+Gc) and Gc/(Rc+Gc) respectively.

Blue and green components may be found by multiplying the difference between an estimate of the output from the panchromatic sensor element attributable to red and the output from a neighboring red sensor element by Bc/(Bc+Gc) and Gc/(Bc+Gc) respectively.

The apparatus 2 may determine chrominance for each picture element corresponding to a sensor element by averaging a value determined by linear interpolating between the luminance values for the nearest bridging monochromatic sensor elements of the same color and by using the difference between the outputs from neighboring sensor elements.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

As used here 'module' refers to a unit or apparatus that excludes certain parts/components that would be added by an end manufacturer or a user.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a plurality of sensor elements, configured in an arrangement having a repeating pattern of sensor elements, the plurality of sensor elements comprising:
   first monochromatic sensor elements configured to sense visible light of a first color;
   second monochromatic sensor elements configured to sense visible light of a second color; and
   panchromatic sensor elements configured to sense visible light of at least the first color and the second color,
   wherein the majority of the plurality of sensor elements are panchromatic sensor elements and wherein each panchromatic sensor element has a corresponding picture element,
   wherein the plurality of sensor elements are arranged in columns and rows,
   wherein the repeating pattern is configured such that a first one of the said second monochromatic sensor elements is separated from a nearest neighboring one of the said second monochromatic sensor elements in the same column or row by two panchromatic sensor elements and a first one of the said first monochromatic sensor elements;
   the apparatus further comprising a processor configured to determine a chrominance for each of the corresponding picture elements corresponding to the panchromatic sensor elements by at least one of: linear interpolating between luminance values for nearest bridging monochromatic sensor elements of a same color; and using a difference between outputs from nearest neighboring sensor elements of the plurality of sensor elements.

2. An apparatus as claimed in claim 1, wherein the repeating pattern of sensor elements within the arrangement comprises a first repeating pattern within the arrangement and a second repeating pattern within the arrangement, wherein the first monochromatic sensor elements are evenly distributed in the first repeating pattern within the arrangement and the second monochromatic sensor elements are evenly distributed in the second repeating pattern within the arrangement.

3. An apparatus as claimed in claim 2, wherein the first repeating pattern within the arrangement and the second repeating pattern within the arrangement comprise the same repeating pattern within the arrangement having a common fixed period in both a first direction and a second, orthogonal direction and wherein the first repeating pattern within the arrangement and the second repeating pattern within the arrangement are respectively offset by one half the common period.

4. An apparatus as claimed in claim 1 further comprising third monochromatic sensor elements configured to sense visible light of a third color wherein the third monochromatic sensor elements are configured in a third repeating pattern within the arrangement.

5. An apparatus as claimed in claim 4, wherein the first color is red, the second color is blue and the third color is green.

6. An apparatus as claimed in claim 5, wherein the arrangement comprises a common base unit repeated in a mosaic to form the plurality of sensor elements, wherein the common base unit comprises sensor elements of which a majority are the panchromatic sensor elements, and wherein the common base unit comprises one of the first monochromatic sensor elements, one of the second monochromatic sensor elements, two of the third monochromatic sensor elements and twelve of the panchromatic sensor elements.

7. An apparatus as claimed in claim 4, wherein the number of sensor elements per unit area for the third monochromatic sensor elements, for every area comprising at least four monochromatic sensor elements, is twice the number of sensor elements per unit area for the first monochromatic sensor elements.

8. An apparatus as claimed in claim 1, wherein the arrangement comprises a common base unit repeated in a mosaic to form the plurality of sensor elements, wherein the common base unit comprises sensor elements of which a majority are the panchromatic sensor elements, and wherein the common base unit comprises two of the first monochromatic sensor elements two of the second monochromatic sensor elements, and twelve panchromatic sensor elements, wherein the first color is red and the second color is blue.

9. An apparatus as claimed in claim 1, wherein the arrangement comprises a common base unit repeated in a mosaic to form the plurality of sensor elements, wherein the common base unit comprises sensor elements of which a majority are the panchromatic sensor elements, and
wherein the common base unit comprises a four by four array of sensor elements and wherein the common base units are tessellated to form the arrangement.

10. An apparatus as claimed in claim 1, wherein the arrangement comprises a common base unit repeated in a mosaic to form the plurality of sensor elements, wherein the common base unit comprises sensor elements of which a majority are the panchromatic sensor elements, and wherein the common base unit is formed from a plurality of sub units, wherein each sub unit comprises a majority of the panchromatic sensor elements and a single one of the first or second monochromatic sensor elements.

11. An apparatus as claimed in claim 10, wherein the single one of the first or second monochromatic sensor elements of a sub unit has a common fixed position within the sub unit for each of the plurality of sub units in the common base unit.

12. An apparatus as claimed in claim 11, wherein the plurality of sub units are arranged in rows and column within the common base unit, and wherein sub units that share the same column but are in adjacent rows comprise different one of the first or second monochromatic sensor elements and wherein sub units that share the same row but are in adjacent columns comprise different one of the first or second monochromatic sensor elements and wherein the common base unit comprises a two by two array of tessellated sub units.

13. An apparatus as claimed in claim 1 further comprising:
circuitry configured to determine a luminance for a picture element corresponding to each one of the first or second monochromatic sensor elements by determining a weighted average luminance for a local group of sensor elements including the respective first or second monochromatic sensor element and multiple adjacent panchromatic sensor elements.

14. An apparatus as claimed in claim 13, wherein a weighting applied to each luminance depends upon a position of the respective sensor element and the color of the respective first or second monochromatic sensor element and wherein a common weighting applied in respect of edge sensor elements of the local group is greater than a common weighting applied in respect of corner sensor elements.

15. A method comprising:
providing for the filtering of light incident on optical sensors using a filter arrangement having a repeating pattern of sensor filters comprising:
first monochromatic sensor filters configured to transmit visible light of a first color significantly more than a second color;
second monochromatic sensor filters configured to transmit visible light of a second color significantly more than the first color; and
panchromatic sensor filters configured to transmit visible light of at least the first color and the second color,
wherein the majority of the sensor filters are panchromatic sensor filters and wherein each panchromatic sensor filter has a corresponding picture element;
wherein the sensor filters are arranged in columns and rows; and
wherein the repeating pattern is configured such that a first one of the said second monochromatic sensor filters is separated from a nearest neighboring second monochromatic sensor filters in the same column or row by two panchromatic sensor filters and a first one of said the first monochromatic sensor filters; and
wherein a chrominance for each of the corresponding picture elements corresponding to the panchromatic sensor filters is determined by at least one of: linear interpolating between luminance values sensed for nearest bridging monochromatic sensor filters of a same color; and using a difference between outputs from nearest neighboring sensor filters.

16. An apparatus comprising:
a plurality of sensor elements, configured in an arrangement having a repeating pattern of sensor elements, the plurality of sensor elements comprising:
first monochromatic sensor elements configured to sense visible light of a first color;
second monochromatic sensor elements configured to sense visible light of a second color; and
panchromatic sensor elements configured to sense visible light of at least the first color and the second color,
wherein the majority of the plurality of sensor elements are panchromatic sensor elements and wherein each panchromatic sensor element has a corresponding picture element;
wherein the plurality of sensor elements are arranged in columns and rows; and
wherein the repeating pattern is configured such that a first one of the said second monochromatic sensor elements is separated from a nearest neighboring one of the said second monochromatic sensor elements in the same column or row by two panchromatic sensor elements and a first one of the said first monochromatic sensor elements; and
means for determining a chrominance for each of the corresponding picture elements corresponding to the panchromatic sensor elements.

* * * * *